United States Patent
Long et al.

(10) Patent No.: US 10,262,572 B2
(45) Date of Patent: Apr. 16, 2019

(54) GATE-ON-ARRAY DRIVING UNIT, GATE-ON-ARRAY DRIVING METHOD, GATE-ON-ARRAY DRIVING CIRCUIT, AND DISPLAY DEVICE

(71) Applicant: BOE TECHNOLOGY GROUP CO., LTD., Beijing (CN)

(72) Inventors: Chunping Long, Beijing (CN); Ying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 233 days.

(21) Appl. No.: 14/778,039

(22) PCT Filed: Mar. 23, 2015

(86) PCT No.: PCT/CN2015/074830
§ 371 (c)(1),
(2) Date: Sep. 17, 2015

(87) PCT Pub. No.: WO2016/070546
PCT Pub. Date: May 12, 2016

(65) Prior Publication Data
US 2016/0293090 A1 Oct. 6, 2016

(30) Foreign Application Priority Data
Nov. 6, 2014 (CN) .......................... 2014 1 0643535

(51) Int. Cl.
*G09G 3/00* (2006.01)
*G09G 3/36* (2006.01)
(Continued)

(52) U.S. Cl.
CPC ............. *G09G 3/2092* (2013.01); *G09G 3/20* (2013.01); *G11C 19/28* (2013.01); *G09G 2310/08* (2013.01)

(58) Field of Classification Search
CPC .... G11C 19/28; G11C 19/184; G09G 3/3677; G09G 3/3266
See application file for complete search history.

(56) References Cited

U.S. PATENT DOCUMENTS

2007/0240024 A1* 10/2007 Shin ....................... G09G 3/325
714/726
2008/0030494 A1 2/2008 Woo et al.
(Continued)

FOREIGN PATENT DOCUMENTS

CN 101197566 A 6/2008
CN 102479476 A 5/2012
(Continued)

OTHER PUBLICATIONS

European Search Report regarding Application No. 15762464.4 dated Mar. 28, 2018.
(Continued)

*Primary Examiner* — Lin Li
(74) *Attorney, Agent, or Firm* — Harness, Dickey & Pierce, P.L.C.

(57) ABSTRACT

GOA driving unit includes an input end, a starting module, a control module, an output module and a gate driving signal output end. The starting module is configured to, within a starting time period, input a triggering signal from the input end into the control module under the control of a first clock signal. The control module is configured to, within an output time period, output a second clock signal to the output module. The output module is configured to output a first level to the gate driving signal output end within the starting time period, output the second clock signal to the gate driving signal output end within the output time period, and output the first level to the gate driving signal output end
(Continued)

within a maintenance time period. The first clock signal is of a phase reverse to the second clock signal.

6 Claims, 3 Drawing Sheets

(51) Int. Cl.
*G09G 3/32* (2016.01)
*G11C 19/28* (2006.01)
*G06F 3/041* (2006.01)
*G09G 3/20* (2006.01)
*G11C 19/18* (2006.01)

(56) References Cited

U.S. PATENT DOCUMENTS

| | | | |
|---|---|---|---|
| 2008/0074359 A1* | 3/2008 | Chung | G09G 3/3266 345/76 |
| 2009/0322737 A1 | 12/2009 | Kim et al. | |
| 2011/0228891 A1* | 9/2011 | Yang | G11C 19/184 377/75 |
| 2012/0133574 A1 | 5/2012 | Wu et al. | |
| 2012/0300894 A1 | 11/2012 | Wu et al. | |
| 2013/0033468 A1 | 2/2013 | Takahashi | |
| 2013/0207956 A1* | 8/2013 | Jang | G09G 3/3266 345/212 |
| 2014/0035889 A1* | 2/2014 | Huang | G09G 3/00 345/204 |
| 2014/0064438 A1 | 3/2014 | Wu et al. | |
| 2014/0079176 A1* | 3/2014 | Qian | G11C 19/28 377/77 |
| 2014/0118052 A1* | 5/2014 | Liu | H03K 5/15093 327/394 |
| 2014/0191937 A1* | 7/2014 | Xu | G09G 3/3648 345/99 |
| 2014/0192039 A1* | 7/2014 | Wang | G11C 19/28 345/213 |
| 2014/0240209 A1 | 8/2014 | Zhang | |
| 2014/0333596 A1* | 11/2014 | Yang | G09G 3/3266 345/209 |
| 2015/0154927 A1* | 6/2015 | Li | G09G 3/3677 345/214 |
| 2015/0262703 A1* | 9/2015 | Murakami | G09G 3/20 345/214 |
| 2015/0279481 A1* | 10/2015 | Sasaki | G11C 19/184 377/69 |
| 2015/0302933 A1 | 10/2015 | Ma | |
| 2016/0217757 A1* | 7/2016 | Tanaka | G02F 1/13454 |

FOREIGN PATENT DOCUMENTS

| | | |
|---|---|---|
| CN | 202443728 U | 9/2012 |
| CN | 102708776 A | 10/2012 |
| CN | 102903323 A | 1/2013 |
| CN | 103295511 A | 9/2013 |
| CN | 104318888 A | 1/2015 |
| CN | 204204376 U | 3/2015 |
| WO | WO-2014134862 A1 | 9/2014 |

OTHER PUBLICATIONS

International Search Report and Written Opinion regarding application No. PCT/CN2015/074830 dated Jul. 24, 2015.
European Search Report regarding application No. 15762464.4-1210/3217383 dated Jun. 20, 2018.
Communication from the European Patent Office regarding Non-Acceptance of Amendments pursuant to Rules 137(1) EPC regarding Application No. 15762464.4-1210/3217383 dated Jun. 7, 2018.

* cited by examiner

GATE-ON-ARRAY DRIVING UNIT, GATE-ON-ARRAY DRIVING METHOD, GATE-ON-ARRAY DRIVING CIRCUIT, AND DISPLAY DEVICE

CROSS-REFERENCE TO RELATED APPLICATION

The present application is the U.S. national phase of PCT Application No. PCT/CN2015/074830 filed on Mar. 23, 2015, which claims a priority of the Chinese patent application No. 201410643535.0 filed on Nov. 6, 2014, which is incorporated herein by reference in its entirety.

TECHNICAL FIELD

The present disclosure relates to the field of display technology, in particular to a gate-on-array (GOA) driving unit, a GOA driving method, a GOA circuit and a display device.

BACKGROUND

Usually, a GOA driving circuit is applied to a low temperature poly-silicon (LTPS) display panel, and two or three clock signals and two direct current (DC) levels (a high level VGH and a low level VGL) are used by most of the GOA circuits, so as to achieve a function of a shift register when gate lines are scanned progressively.

As shown in FIG. 1, an existing $N^{th}$-level GOA driving unit of the GOA driving circuit for the LTPS display panel includes an input end, a first transistor T1, a second transistor T2, a third transistor T3, a fourth transistor T4, a fifth transistor T5, a sixth transistor T6, a seventh transistor T7, a first capacitor C1, a second capacitor C2, and a gate driving signal output end $G_N$. T1, T2, T3, T4, T5, T6 and T7 are all p-type transistors. The input end is configured to receive an $(N-1)^{th}$ gate driving signal $G_{N-1}$ from an $(N-1)^{th}$ GOA driving unit as a triggering signal, the gate driving signal output end $G_N$ is configured to output an $N^{th}$ gate driving signal, and N is an integer greater than 1.

The existing GOA driving circuit includes seven transistors and two storage capacitors, and it uses two clock signals (a first clock signal CLK and a second clock signal CLKB) and two DC signals (the high level VGH and the low level VGL). Too many signal lines and transistors are used by the 7T2C-based GOA driving circuit, so it is difficult to provide a display device with a narrow bezel having a width of less than 1 mm.

SUMMARY

A main object of the present disclosure is to provide a GOA driving unit, a GOA driving method, a GOA driving circuit and a display device, so as to provide a product with a narrow bezel.

In one aspect, the present disclosure provides in one embodiment a GOA driving unit including an input end, a starting module, a control module, an output module and a gate driving signal output end. The starting module is configured to, within a starting time period for each display cycle, input a triggering signal from the input end into the control module under the control of a first clock signal. The control module is configured to, within an output time period for each display cycle, output a second clock signal to the output module under the control of the first clock signal, a first level and the triggering signal. The output module is configured to output the first level to the gate driving signal output end within the starting time period for each display cycle under the control of the first clock signal, output the second clock signal to the gate driving signal output end within the output time period for each display cycle, and output the first level to the gate driving signal output end within a maintenance time period for each display cycle under the control of the first clock signal. The first clock signal is of a phase reverse to the second clock signal.

Alternatively, the starting module includes a starting transistor, a gate electrode of which is configured to receive the first clock signal, a first electrode of which is configured to receive the triggering signal from the input end, and a second electrode of which is connected to the control module.

Alternatively, the control module includes a first controlling transistor, a gate electrode of which is connected to the starting module and a first electrode of which is configured to receive the second clock signal; a second controlling transistor, a gate electrode of which is configured to receive the first clock signal, a first electrode of which is configured to receive the first level, and a second electrode of which is connected to the second electrode of the first controlling transistor and the output module; and a maintaining capacitor connected between the gate electrode and the second electrode of the first controlling transistor.

Alternatively, the output module includes a first outputting transistor, a gate electrode of which is configured to receive the first clock signal, a first electrode of which is configured to receive the first level, and a second electrode of which is connected to the gate driving signal output end; and a second outputting transistor, a gate electrode of which is connected to the second electrode of the second controlling transistor, a first electrode of which is connected to the gate driving signal output end, and a second electrode of which is configured to receive the second clock signal.

Alternatively, the starting transistor, the first controlling transistor, the second controlling transistor, the first outputting transistor and the second outputting transistor are all p-type transistors, and the first level is a high level.

Alternatively, the starting transistor, the first controlling transistor, the second controlling transistor, the first outputting transistor and the second outputting transistor are all n-type transistors, and the first level is a low level.

In another aspect, the present disclosure provides in one embodiment a GOA driving method for use in the above-mentioned GOA driving unit, including steps of: within a starting time period for each display cycle, inputting, by a starting module, a triggering signal from an input end to a control module under the control of a first clock signal, and outputting, by an output module, a first level to a gate driving signal output end under the control of the first clock signal; within an output time period for each display cycle, outputting, by the control module, a second clock signal to the output module under the control of the first clock signal, a first level and the triggering signal, and outputting, by the output module, the second clock signal to the gate driving signal output end; and within a maintenance time period for each display cycle, outputting, by the output module, the first level to the gate driving signal output end under the control of the first clock signal.

In yet another aspect, the present disclosure provides in one embodiment a GOA driving method for use in the above-mentioned GOA driving unit, including steps of: within a starting time period for each display cycle, enabling a first outputting transistor and a starting transistor to be in an on state under the control of a first clock signal, outputting a first level to a gate driving signal output end, outputting a triggering signal to a gate electrode of a first controlling transistor so as to enable the first controlling transistor to be in the on state, and outputting a second clock signal to a gate electrode of a second outputting transistor so as to enable the second outputting transistor to be in an off state; within an output time period for each display cycle, enabling the starting transistor to be in the off state under the control of the first clock signal, enabling the second controlling transistor to be in the off state under the control of the first clock signal so as not to output the first level to the gate electrode of the second outputting transistor, enabling a first outputting transistor to be in the off state under the control of the first clock signal so as not to output the first level to the gate driving signal output end, maintaining, by a maintaining capacitor, a potential at the gate electrode of the first controlling transistor so as to maintain the first controlling transistor to be in the on state, thereby enabling the second outputting transistor to be in the on state and outputting the second clock signal to the gate driving signal output end; and within a maintenance time period for each display cycle, in a clock cycle, enabling the first outputting transistor to be in the on state under the control of the first clock signal, enabling the starting transistor to be in the on state under the control of the first clock signal so as to enable the gate electrode of the first controlling transistor to receive the triggering signal and thereby enable the first controlling transistor to be in the off state, enabling the second controlling transistor to be in the on state under the control of the first clock signal so as to enable the gate electrode of the second outputting transistor to receive the first level, and enabling the second outputting transistor to be in the off state so as to ensure the output of the first level to the gate driving signal output end; and in a next clock cycle, enabling the first outputting transistor to be in the off state under the control of the first clock signal, maintaining, by the maintaining capacitor, a potential at the gate electrode of the second outputting transistor so as to enable the second outputting transistor to be in the off state and thereby maintain the gate driving signal output end to be at the first level.

In still yet another aspect, the present disclosure provides in one embodiment a GOA driving circuit including multiple levels of the above-mentioned GOA driving units. Apart from a first-level GOA driving unit, an input end of a current-level GOA driving unit is connected to a gate driving signal output end of a previous-level GOA driving unit, and an input end of the first-level GOA driving unit is configured to receive a start signal.

In still yet another aspect, the present disclosure provides in one embodiment a display device including the above-mentioned GOA driving circuit.

As compared with the related art, merely five transistors and one capacitor are used in the GOA driving unit in the embodiments of the present disclosure, and meanwhile merely three signal lines are used for driving. Hence, it is able to reduce an area of the GOA driving circuit and thereby to provide a display device with a narrow bezel. In addition, it is able to ensure the stability and reliability of the GOA driving circuit while reducing the number of the transistors and the signal lines. Furthermore, existing driving sequences and integrated circuits may be also be used, so it is able to reduce the production cost.

DETAILED DESCRIPTION

The present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may, without any creative effort, obtain the other embodiments, which also fall within the scope of the present disclosure.

Figure 1:
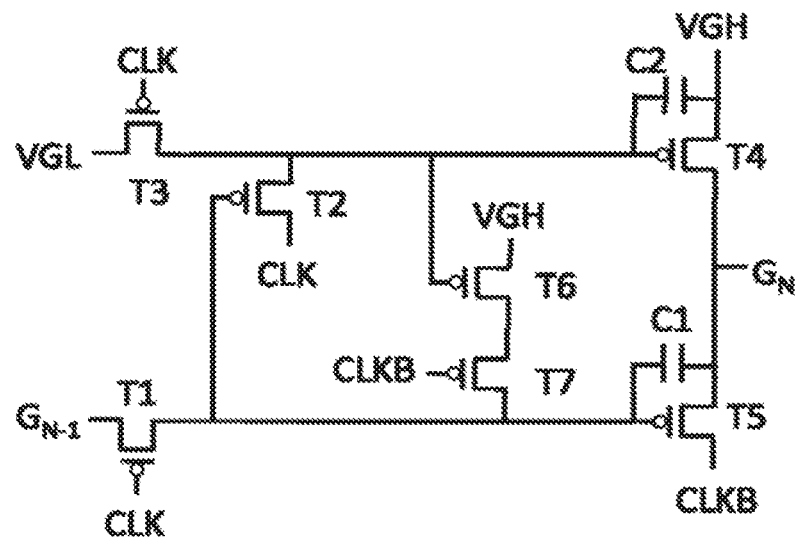
FIG. 1 is a circuit diagram of an existing GOA driving circuit.
Figure 2:
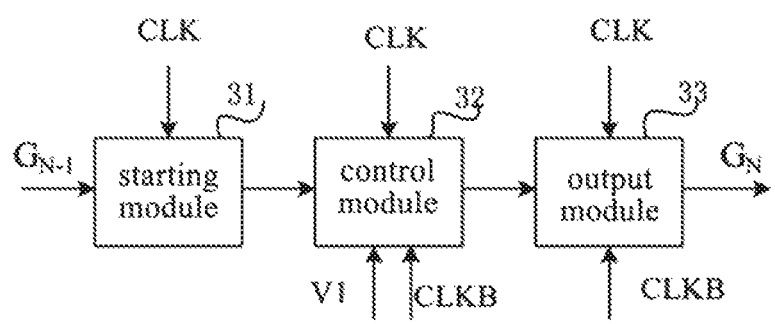
FIG. 2 is a schematic view showing a GOA driving unit according to one embodiment of the present disclosure.

As shown in FIG. 2, a GOA driving unit in one embodiment of the present disclosure includes an input end, a starting module 31, a control module 32, an output module 33 and a gate driving signal output end $G_N$. The starting module 31 is configured to, within a starting time period for each display cycle, input a triggering signal $G_{N-1}$ from the input end into the control module 32 under the control of a first clock signal CLK. The control module 32 is configured to, within an output time period for each display cycle, output a second clock signal CLKB to the output module 33 under the control of the first clock signal CLK, a first level V1 and the triggering signal $G_{N-1}$. The output module 33 is configured to output the first level V1 to the gate driving signal output end $G_N$ within the starting time period for each display cycle under the control of the first clock signal CLK, output the second clock signal CLKB to the gate driving signal output end $G_N$ within the output time period for each display cycle, and output the first level V1 to the gate driving signal output end $G_N$ within a maintenance time period for each display cycle under the control of the first clock signal CLK. The first clock signal CLK is of a phase reverse to the second clock signal CLKB.

During the actual operation, the triggering signal is a gate driving signal $G_{N-1}$ from a previous-level GOA driving unit.

Merely one DC signal (the first level V1) is adopted by the GOA driving unit in the embodiments of the present disclosure, and as compared with the related art, fewer signal lines are used. As a result, it is able to reduce an area of a GOA driving circuit, thereby to provide a display device with a narrow bezel.

All the transistors used in the embodiments of the present disclosure may be thin film transistors (TFTs), field effect transistors (FETs) or any other elements with the same characteristics. In the embodiments of the present disclosure, in order to differentiate two electrodes, other than a gate electrode, from each other, a first electrode may be a source or drain electrode, and a second electrode may be a drain or source electrode. In addition, depending on their characteristics, the transistors may be n-type or p-type transistors. In the driving circuit according to embodiments of the present disclosure, the p-type transistors are taken as an example. Of course, the n-type transistors may also be used.

To be specific, the starting module includes a starting transistor, a gate electrode of which is configured to receive the first clock signal, a first electrode of which is configured to receive the triggering signal from the input end, and a second electrode of which is connected to the control module.

To be specific, the control module includes a first controlling transistor, a gate electrode of which is connected to the starting module and a first electrode of which is configured to receive the second clock signal; a second controlling transistor, a gate electrode of which is configured to receive the first clock signal, a first electrode of which is configured to receive the first level, and a second electrode of which is connected to the second electrode of the first controlling transistor and the output module; and a maintaining capacitor connected between the gate electrode and the second electrode of the first controlling transistor.

To be specific, the output module includes a first outputting transistor, a gate electrode of which is configured to receive the first clock signal, a first electrode of which is configured to receive the first level, and a second electrode of which is connected to the gate driving signal output end; and a second outputting transistor, a gate electrode of which is connected to the second electrode of the second controlling transistor, a first electrode of which is connected to the gate driving signal output end, and a second electrode of which is configured to receive the second clock signal.

The GOA driving unit will be described hereinafter in conjunction with a specific embodiment.

Figure 3:
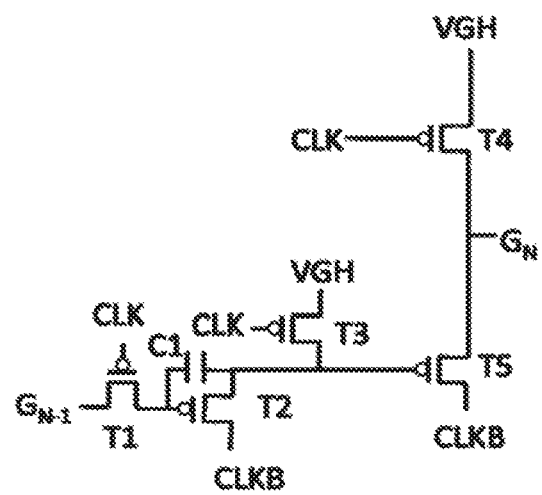
FIG. 3 is a circuit diagram of the GOA driving unit according to one embodiment of the present disclosure.

As shown in FIG. 3, in the GOA driving unit, the starting module 31 includes a starting transistor T1, a gate electrode of which is configured to receive the first clock signal CLK, and a first electrode of which is configured to receive the triggering signal from the input end. The control module 32 includes a first controlling transistor T2, a gate electrode of which is connected to a second electrode of the starting transistor T1 and a first electrode of which is configured to receive the second clock signal CLKB; a second controlling transistor T3, a gate electrode of which is configured to receive the first clock signal CLK, a first electrode of which is configured to receive the first level VGH, and a second electrode of which is connected to the second electrode of the first controlling transistor T2; and a maintaining capacitor C1 connected between the gate electrode and the second electrode of the first controlling transistor T2.

The output module 33 includes a first outputting transistor T4, a gate electrode of which is configured to receive the first clock signal CLK, a first electrode of which is configured to receive the first level VGH, and a second electrode of which is connected to the gate driving signal output end $G_N$; and a second outputting transistor T5, a gate electrode of which is connected to the second electrode of the second controlling transistor T3, a first electrode of which is connected to the gate driving signal output end $G_N$, and a second electrode of which is configured to receive the second clock signal CLKB. T1, T2, T3, T4 and T5 are all p-type transistors.

During the actual operation, T1, T2, T3, T4 and T5 may, partially or fully, be replaced with n-type TFTs. At this time, the control signals for the gate electrodes of the transistors may be changed, i.e., the triggering signal, the first clock signal and the second clock signal may each be replaced with a signal of a phase reverse to that for the p-type TFT, and meanwhile the first level may be changed from a high level to a low level. This change is known in the art, and thus will not be particularly defined herein.

For the GOA driving unit in FIG. 3, merely five transistors and one capacitor are used, and meanwhile merely three signal lines are used for driving. As a result, it is able to reduce an area of the GOA driving circuit, thereby to provide a display device with a narrow bezel.

Figure 4:
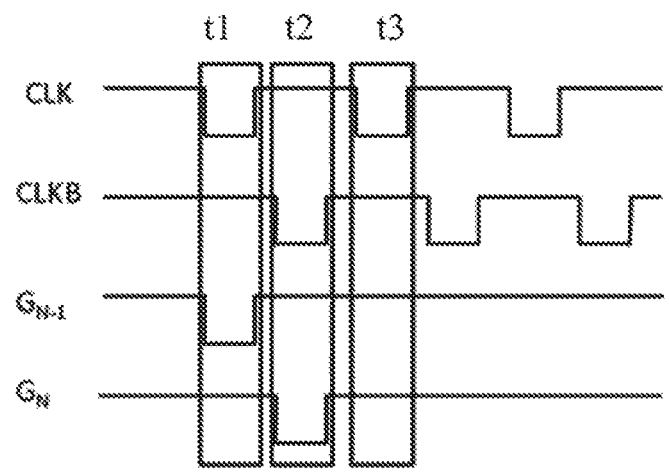
FIG. 4 is a sequence diagram of the GOA driving unit according to one embodiment of the present disclosure.

An operating sequence for the GOA driving unit in the embodiments of the present disclosure is identical to that for the existing GOA driving unit, as shown in FIG. 4.

Referring to FIG. 4, during the operation of the GOA driving unit in FIG. 3, at a data writing-in stage, within a starting time period t1, CLK is a low level so as to enable T4 to be in an on state and output the high level VGH to $G_N$; CLK serves as a start signal so as to enable T1 to be in the on state; $G_{N-1}$ serves as the triggering signal and it is a low level, and at this time, the gate electrode of T2 is at a low level and T2 is in the on state; CLKB is a high level, and at this time, the gate electrode of T5 is at a high level and T5 is in the off state; CLK is a low level, and at this time, T3 is in the on state, and the gate electrode of T5 receives the high level VGH, so as to ensure that T5 is in the off state; VGH is outputted to $G_N$. Within an output time period t2, CLK is a high level so as to enable T1 to be in the off state; $G_{N-1}$ is a low level; the gate electrode of T2 is maintained at a low level through C1, so as to maintain T2 to be in the on state; at this time, CLKB is changed to a low level, and the gate electrode of T5 is at a low level so as to enable T5 to be in the on state and enable $G_N$ to receive CLKB; T3 is in the off state under the control of CLK, so that VGH is not outputted to the gate electrode of T5 and CLKB is outputted by T5 to $G_N$; T4 is in the off state under the control of CLK, so that VGH is not outputted to $G_N$. At a data maintenance stage, within a maintenance time period t3, in a clock cycle, CLK is changed to a low level so as to enable T4 to be in the on state and output VGH to $G_N$; T1 is in the on state under the control of CLK, so as to enable the gate electrode of T2 to receive $G_{N-1}$; at this time, $G_{N-1}$ is a high level, so the gate electrode of T2 is at a high level, and T2 is in the off state; T3 is in the on state under the control of CLK, so as to enable the gate electrode of T5 to receive VGH, enable T5 to be in the off state and output VGH to $G_N$; in a next clock cycle, CLK is changed to a high level so as to enable T4 to be in the off state; the gate electrode of T5 is maintained at a high level through C1, so as to enable T5 to be in the off state and maintain the output end $G_N$ at a high level.

During the display of a next frame, the data writing-in stage and the data maintenance stage may be repeated.

During the operation of the GOA driving unit in the embodiments of the present disclosure, within a portion of the time period for displaying one frame, the gate electrode of T4 is controlled by CLK, so as to maintain a voltage at a floating node (i.e., a node connected to the gate electrode of T4) of the dynamic circuit to be identical to that in the related art. As a result, it is able to ensure the stability and reliability of the GOA driving circuit while reducing the number of the transistors and signal lines.

In addition, the GOA driving circuit in the embodiments of the present disclosure may use the existing driving sequences and integrated circuits, so as to reduce the production cost.

The present disclosure further provides in one embodiment a GOA driving method for use in the above-mentioned GOA driving unit, including steps of: within the starting time period for each display cycle, inputting, by the starting module, the triggering signal from the input end to the control module under the control of the first clock signal, and outputting, by the output module, the first level to the gate driving signal output end under the control of the first clock signal; within the output time period for each display cycle, outputting, by the control module, the second clock signal to the output module under the control of the first clock signal, the first level and the triggering signal, and outputting, by the output module, the second clock signal to the gate driving signal output end; and within the maintenance time period for each display cycle, outputting, by the output module, the first level to the gate driving signal output end under the control of the first clock signal.

The present disclosure further provides in another embodiment a GOA driving method for use in the above-mentioned GOA driving unit, including steps of: within the starting time period for each display cycle, enabling the first outputting transistor and the starting transistor to be in the on state under the control of the first clock signal, outputting the first level to the gate driving signal output end, outputting the triggering signal to the gate electrode of the first controlling transistor so as to enable the first controlling transistor to be in the on state, and outputting the second clock signal to the gate electrode of the second outputting transistor so as to enable the second outputting transistor to be in the off state; within the output time period for each display cycle, enabling the starting transistor to be in the off state under the control of the first clock signal, enabling the second controlling transistor to be in the off state under the control of the first clock signal so as not to output the first level to the gate electrode of the second outputting transistor, enabling a first outputting transistor to be in the off state under the control of the first clock signal so as not to output the first level to the gate driving signal output end, maintaining, by the maintaining capacitor, a potential at the gate electrode of the first controlling transistor so as to maintain the first controlling transistor to be in the on state, thereby enabling the second outputting transistor to be in the on state and outputting the second clock signal to the gate driving signal output end; and within the maintenance time period for each display cycle, in a clock cycle, enabling the first outputting transistor to be in the on state under the control of the first clock signal, enabling the starting transistor to be in the on state under the control of the first clock signal so as to enable the gate electrode of the first controlling transistor to receive the triggering signal and thereby enable the first controlling transistor to be in the off state, enabling the second controlling transistor to be in the on state under the control of the first clock signal so as to enable the gate electrode of the second outputting transistor to receive the first level, and enabling the second outputting transistor to be in the off state so as to ensure the output of the first level to the gate driving signal output end; and in a next clock cycle, enabling the first outputting transistor to be in the off state under the control of the first clock signal, maintaining, by the maintaining capacitor, a potential at the gate electrode of the second outputting transistor so as to enable the second outputting transistor to be in the off state and thereby maintain the gate driving signal output end to be at the first level.

Figure 5:
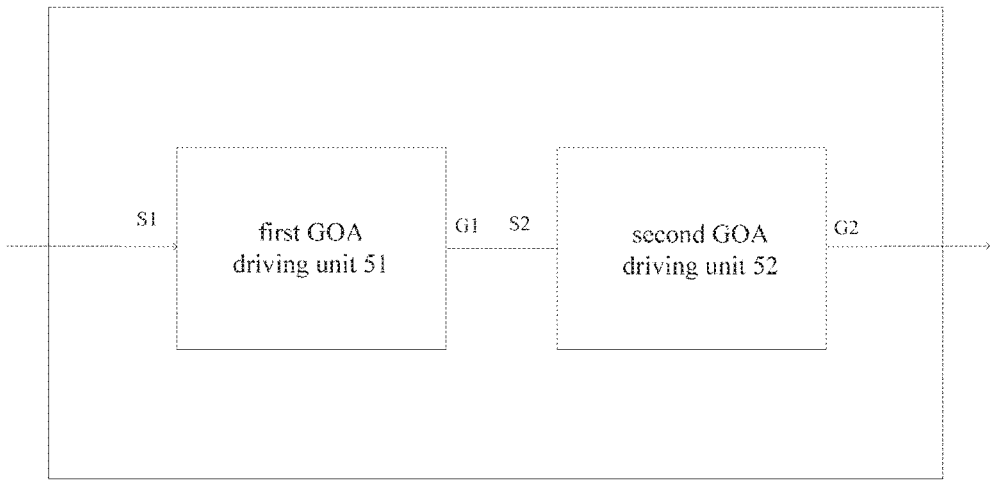
FIG. 5 is a schematic diagram of a GOA driving circuit according to at least one embodiment of the present disclosure.

The present disclosure further provides in one embodiment a GOA driving circuit including multiple levels of the above-mentioned GOA driving units. Apart from a first-level GOA driving unit, an input end of a current-level GOA driving unit is connected to a gate driving signal output end of a previous-level GOA driving unit, and an input end of the first-level GOA driving unit is configured to receive a start signal. The GOA driving circuit in the embodiments of the present disclosure may be applied to an LTPS display device. As shown in FIG. 5, a GOA driving circuit 500 includes a first GOA driving unit 51 as a first-level GOA driving unit and a second GOA driving unit 52 as a second-level GOA driving unit. An input end S1 of the first GOA driving unit 51 receives the start signal, an output end G1 of the first GOA driving unit 51 is connected with and outputs a gate driving signal to an input end S2 of the second GOA driving unit 52. An output end G2 of the second GOA driving unit 52 outputs a gate driving signal as the output signal of the GOA driving circuit 500. It should be understood that any other number of GOA driving units may be included in the GOA driving circuit, and the present disclosure is not limited herein.

Figure 6:
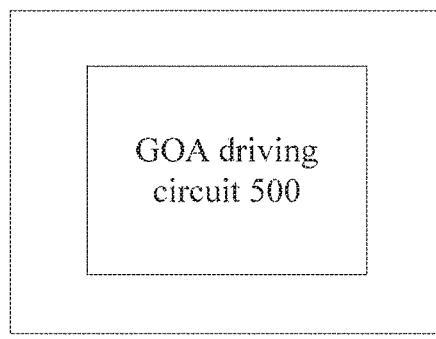
FIG. 6 is a schematic diagram of a display device according to at least one embodiment of the present disclosure.

The present disclosure further provides in one embodiment a display device including the above-mentioned GOA driving circuit. The display device may be an LTPS display device. As shown in FIG. 6, a display device 600 includes a GOA driving circuit 500 as shown in FIG. 5. Although only one GOA driving circuit is shown in FIG. 6, it should be understood that any other number of GOA driving units may be included in the GOA driving circuit, and the present disclosure is not limited herein.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A gate-on-array (GOA) driving unit, comprising an input end, a starting circuit, a control circuit, an output circuit, and a gate driving signal output end, wherein
the starting circuit comprises a starting transistor, a gate electrode of the starting transistor is configured to receive a first clock signal, a first electrode of the starting transistor is configured to receive a triggering signal from the input end, and a second electrode of the starting transistor is connected to the control circuit;
the starting circuit is configured to, within a starting time period for each display cycle, input the triggering signal from the input end into the control circuit under the control of the first clock signal;
the control circuit is configured to, within an output time period for each display cycle, output a second clock signal to the output circuit under the control of the first clock signal, a first level and the triggering signal;
the output circuit is configured to output the first level to the gate driving signal output end within the starting time period for each display cycle under the control of the first clock signal, output the second clock signal to the gate driving signal output end within the output time period for each display cycle and maintain a phase of a gate driving signal output by the gate driving signal output end being the same as a phase of the second clock signal, and output the first level to the gate driving signal output end within a maintenance time period for each display cycle under the control of the first clock signal;
the first clock signal is of a phase reverse to the second clock signal; and
wherein the control circuit comprises:
a first controlling transistor, a gate electrode of the first controlling transistor is connected to the starting circuit and a first electrode of the first controlling transistor is configured to receive the second clock signal;
a second controlling transistor, a gate electrode of the second controlling transistor is configured to receive the first clock signal, a first electrode of the second controlling transistor is configured to receive the first level, and a second electrode of the second controlling transistor is connected to the second electrode of the first controlling transistor and the output circuit; and a maintaining capacitor connected between the gate electrode and the second electrode of the first controlling transistor, wherein the output circuit comprises:

a first outputting transistor, a gate electrode of the first outputting transistor is configured to receive the first clock signal, a first electrode of the first outputting transistor is configured to receive the first level, and a second electrode of the first outputting transistor is connected to the gate driving signal output end and configured to provide the first level to the gate driving signal output end during the starting time period for each display cycle; and a second outputting transistor, a gate electrode of the second outputting transistor is connected to the second electrode of the second controlling transistor, a first electrode of the second outputting transistor is connected to the gate driving signal output end, and a second electrode of the second outputting transistor is configured to receive the second clock signal and configured to provide the second clock signal to the gate driving signal output end during the output time period for each display cycle.

2. The GOA driving unit according to claim 1, wherein the starting transistor, the first controlling transistor, the second controlling transistor, the first outputting transistor and the second outputting transistor are p-type transistors; and the first level is a high level.

3. The GOA driving unit according to claim 1, wherein the starting transistor, the first controlling transistor, the second controlling transistor, the first outputting transistor and the second outputting transistor are n-type transistors; and the first level is a low level.

4. A gate-on-array (GOA) driving circuit, comprising multiple levels of the GOA driving units according to claim 1, wherein apart from a first-level GOA driving unit, an input end of a current-level GOA driving unit is connected to a gate driving signal output end of a previous-level GOA driving unit, and an input end of the first-level GOA driving unit is configured to receive a start signal.

5. A display device, comprising the gate-on-array (GOA) driving circuit according to claim 4.

6. A method for driving the GOA driving unit, the method comprising:

within a starting time period for each display cycle, enabling a first outputting transistor and a starting transistor to be in an on state under the control of a first clock signal, outputting a first level to a gate driving signal output end, outputting a triggering signal to a gate electrode of a first controlling transistor so as to enable the first controlling transistor to be in the on state, and outputting a second clock signal to a gate electrode of a second outputting transistor so as to enable the second outputting transistor to be in an off state;

within an output time period for each display cycle, enabling the starting transistor to be in the off state under the control of the first clock signal, enabling a second controlling transistor to be in the off state under the control of the first clock signal so as not to output the first level to the gate electrode of the second outputting transistor, enabling a first outputting transistor to be in the off state under the control of the first clock signal so as not to output the first level to the gate driving signal output end, maintaining, by a maintaining capacitor, a potential at the gate electrode of the first controlling transistor so as to maintain the first controlling transistor to be in the on state, thereby enabling the second outputting transistor to be in the on state and outputting the second clock signal to the gate driving signal output end; and within a maintenance time period for each display cycle, in a clock cycle, enabling the first outputting transistor to be in the on state under the control of the first clock signal, enabling the starting transistor to be in the on state under the control of the first clock signal so as to enable the gate electrode of the first controlling transistor to receive the triggering signal and thereby enable the first controlling transistor to be in the off state, enabling the second controlling transistor to be in the on state under the control of the first clock signal so as to enable the gate electrode of the second outputting transistor to receive the first level, and enabling the second outputting transistor to be in the off state so as to ensure the output of the first level to the gate driving signal output end; and in a next clock cycle, enabling the first outputting transistor to be in the off state under the control of the first clock signal, maintaining, by the maintaining capacitor, a potential at the gate electrode of the second outputting transistor so as to enable the second outputting transistor to be in the off state and thereby maintain the gate driving signal output end to be at the first level, wherein a gate electrode of the first outputting transistor is configured to receive the first clock signal, a first electrode of the first outputting transistor is configured to receive the first level, and a second electrode of the first outputting transistor is connected to the gate driving signal output end and configured to provide the first level to the gate driving signal output end during the starting time period for each display cycle, and wherein a gate electrode of the second outputting transistor is connected to the second electrode of the second controlling transistor, a first electrode of the second outputting transistor is connected to the gate driving signal output end, and a second electrode of the second outputting transistor is configured to receive the second clock signal and configured to provide the second clock signal to the gate driving signal output end during the output time period for each display cycle.

\* \* \* \* \*